United States Patent
Blumhagen et al.

(10) Patent No.: US 10,042,022 B2
(45) Date of Patent: Aug. 7, 2018

(54) METHOD FOR MAGNETIC RESONANCE IMAGING AND MAGNETIC RESONANCE DEVICE

(71) Applicants: Jan Ole Blumhagen, Erlangen (DE); Dominik Paul, Bubenreuth (DE)

(72) Inventors: Jan Ole Blumhagen, Erlangen (DE); Dominik Paul, Bubenreuth (DE)

(73) Assignee: Siemens Aktiengesellschaft, München (DE)

( * ) Notice: Subject to any disclaimer, the term of this patent is extended or adjusted under 35 U.S.C. 154(b) by 646 days.

(21) Appl. No.: 14/645,190

(22) Filed: Mar. 11, 2015

(65) Prior Publication Data
US 2015/0260811 A1    Sep. 17, 2015

(30) Foreign Application Priority Data
Mar. 11, 2014 (DE) .................. 10 2014 204 451

(51) Int. Cl.
| | |
|---|---|
| G01V 3/00 | (2006.01) |
| G01R 33/3875 | (2006.01) |
| G01R 33/54 | (2006.01) |
| G01R 33/24 | (2006.01) |
| G01R 33/483 | (2006.01) |
| G01R 33/565 | (2006.01) |

(52) U.S. Cl.
CPC ........ *G01R 33/3875* (2013.01); *G01R 33/243* (2013.01); *G01R 33/4835* (2013.01); *G01R 33/543* (2013.01); *G01R 33/56563* (2013.01)

(58) Field of Classification Search
USPC ....................................................... 324/320
See application file for complete search history.

(56) References Cited

U.S. PATENT DOCUMENTS

| | | | | |
|---|---|---|---|---|
| 7,683,614 B2* | 3/2010 | Posse | .................. | G01R 33/485 324/307 |
| 2005/0154291 A1* | 7/2005 | Zhao | .................. | G01R 33/3873 600/410 |
| 2006/0033494 A1 | 2/2006 | Hennig et al. | | |
| 2009/0005670 A1* | 1/2009 | Ichinose | .......... | G01R 33/56308 600/410 |
| 2010/0045291 A1* | 2/2010 | Greiser | ................ | G01R 33/543 324/309 |
| 2010/0102819 A1* | 4/2010 | Zaitsev | ............ | G01R 33/56563 324/320 |
| 2010/0234723 A1 | 9/2010 | Xu | | |

(Continued)

FOREIGN PATENT DOCUMENTS

DE    102004038917 A1    2/2006

OTHER PUBLICATIONS

German Office Action for related German Application No. 10 2014 204 451.0, dated Mar. 2, 2015, with English Translation.

*Primary Examiner* — Rodney Fuller
(74) *Attorney, Agent, or Firm* — Lempia Summerfield Katz LLC

(57) ABSTRACT

In order to provide an improved homogeneity of a primary magnetic field during a magnetic resonance imaging process, a method for magnetic resonance imaging of a subject under examination using a magnetic resonance device includes an acquisition of magnetic resonance image data in a plurality of scanning blocks. Different shim settings are set in each case for the plurality of scanning blocks.

10 Claims, 3 Drawing Sheets

(56) References Cited

U.S. PATENT DOCUMENTS

| | | | |
|---|---|---|---|
| 2010/0244823 A1* | 9/2010 | Abe | A61B 5/055 324/309 |
| 2012/0235681 A1* | 9/2012 | Stemmer | G01R 33/4835 324/307 |
| 2013/0038327 A1* | 2/2013 | Fautz | G01R 33/4833 324/309 |
| 2013/0187650 A1 | 7/2013 | Pfeuffer et al. | |
| 2013/0278258 A1* | 10/2013 | Smith | G01R 33/56 324/309 |
| 2017/0123027 A1* | 5/2017 | Zuehlsdorff | G01R 33/3875 |
| 2017/0242089 A1* | 8/2017 | Kiefer | G01R 33/56563 |

* cited by examiner

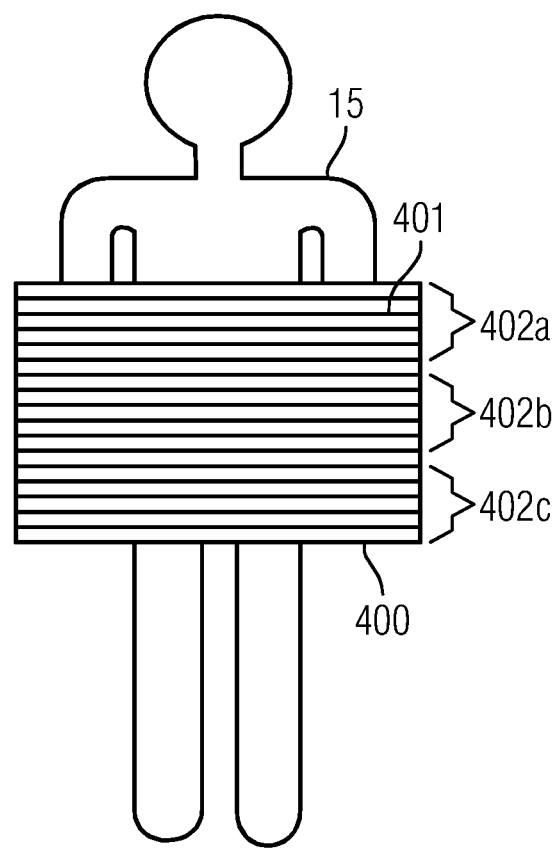

METHOD FOR MAGNETIC RESONANCE IMAGING AND MAGNETIC RESONANCE DEVICE

This application claims the benefit of DE 10 2014 204 451.0, filed on Mar. 11, 2014, which is hereby incorporated by reference in its entirety.

BACKGROUND

In a magnetic resonance device (e.g., a magnetic resonance computed tomography system), the body of a person to be examined (e.g., a patient) may be subjected to a relatively high primary magnetic field (e.g., 1.5 or 3 or 7 Tesla) with the aid of a primary magnetic. In addition, gradient pulses are delivered with the aid of a gradient coil unit. High-frequency radio-frequency pulses are then emitted by suitable antenna arrangements via a radio-frequency antenna unit (e.g., excitation pulses), which provides that the nuclear spins of particular atoms resonantly excited by the radio-frequency pulses are tilted by a defined flip angle with respect to the magnetic field lines of the primary magnetic field. When the nuclear spins are relaxed, radio-frequency signals (e.g., magnetic resonance signals) are emitted, received by suitable radio-frequency antennas, and processed further. Finally, the desired image data can be reconstructed from the raw data thus acquired.

For a particular measurement, a particular magnetic resonance sequence (e.g., a pulse sequence) that consists of a series of radio-frequency pulses (e.g., excitation pulses and refocussing pulses as well) as gradient pulses appropriately coordinated therewith to be transmitted in different gradient axes along different spatial directions is therefore to be transmitted. Readout windows chronologically appropriate for this purpose that predetermine the periods of time in which the induced magnetic resonance signals are acquired are set.

With regard to magnetic resonance imaging using a magnetic resonance device, the homogeneity of a primary magnetic field in an examination volume is of importance. Even in the case of small variations in the homogeneity, large variations may occur in a frequency distribution of the nuclear spins, which provides that qualitatively substandard magnetic resonance image data is acquired.

In order to improve the homogeneity in the examination volume, shim arrangements are known. When a magnetic resonance device is installed at a desired location, then fields present in the surrounding area may restrict the default homogeneity of the primary magnetic field (e.g., around an isocenter of the magnetic resonance device). Therefore, during installation and commissioning of a magnetic resonance device, frequently in conjunction with measurements, the shim arrangement is set up such that as optimal a homogeneity as possible is established. Basic shim settings are thereby computed during the installation and commissioning of the magnetic resonance device.

The subject to be examined does, however, itself constitute a further source of inhomogeneity. When, for example, a person to be examined is introduced into the magnetic resonance device, then the matter of the body again disrupts the homogeneity. In order to counter this problem, the use of an adjustable shim unit is known. For example, electrical shim coils are known for this purpose. Electrical shim coils, when driven with different shim currents, generate different compensation magnetic fields in order to improve the homogeneity.

In order to shim the disruptions of the subject to be examined, it is common practice, when driving the shim unit by the basic shim settings obtained during the installation and commissioning of the magnetic resonance facility, to use the magnetic resonance device itself to undertake a measurement of the field distribution when the person to be examined has been introduced into a patient receiving area of the magnetic resonance device. Thereafter, based on the basic shim settings, optimized shim settings are ascertained by a control unit while taking into consideration the measured field distribution. Using the optimized shim settings, the shim unit is then driven in order to achieve as optimal a homogeneity as possible.

SUMMARY AND DESCRIPTION

The scope of the present invention is defined solely by the appended claims and is not affected to any degree by the statements within this summary.

The present embodiments may obviate one or more of the drawbacks or limitations in the related art. For example, improved homogeneity of a primary magnetic field during a magnetic resonance imaging process is provided.

A method for magnetic resonance imaging of a subject under examination using a magnetic resonance device is provided. An acquisition of magnetic resonance image data takes place in a plurality of scanning blocks. Different shim settings are set in each case for the plurality of scanning blocks.

The subject to be examined may be a patient, a training person or a phantom. Based on the magnetic resonance image data acquired in the plurality of scanning blocks, magnetic resonance images, for example, are produced by a computer unit of the magnetic resonance device. The magnetic resonance images may be output on a display unit of the magnetic resonance device and/or stored in a database.

The acquisition of the magnetic resonance image data takes place, for example, in chronologically separated fashion for the plurality of scanning blocks. This provides that, for example, magnetic resonance image data is initially acquired in a first scanning block of the plurality of scanning blocks, and thereafter, magnetic resonance image data is acquired in a second scanning block of the plurality of scanning blocks, etc. In this situation, there may be any number of scanning blocks, provided the number is greater than one.

The acquisition of magnetic resonance image data is, for example, distributed over the plurality of scanning blocks. This may provide that a first part of the magnetic resonance image data is acquired in a first scanning block of the plurality of scanning blocks, a second part of the magnetic resonance image data is acquired in a second scanning block of the plurality of scanning blocks, etc. After acquisition of the magnetic resonance image data, the multiple parts of the magnetic resonance image data are then combined (e.g., in order to reconstruct the magnetic resonance images). Different advantageous possibilities for distributing the acquisition of the magnetic resonance image data over scanning blocks are described in embodiments of the method.

Shim settings may include settings for driving a shim unit of the magnetic resonance device. For example, the shim settings may define a possibly time-dependent current distribution of the currents in shim coils of the shim unit. Based on shim settings, a frequency adjustment may be carried out prior to the acquisition of magnetic resonance image data. The different shim settings may be computed prior to the acquisition of the magnetic resonance image data.

For example, mutually different shim settings are set for the plurality of scanning blocks. This may provide that first shim settings are set for a first scanning block, second shim settings are set for a second scanning block, etc.

The shim settings may thus be matched in each case to a plurality of scanning blocks. The different shim settings matched to the plurality of scanning blocks may thus result in an improved homogeneity of the primary magnetic field during the acquisition of the magnetic resonance image data in the plurality of scanning blocks. The improved homogeneity of the primary magnetic field may result in an improvement in the image quality of magnetic resonance images reconstructed from the magnetic resonance image data.

An embodiment provides that the acquisition of the magnetic resonance image data takes place by using a magnetic resonance sequence. The plurality of scanning blocks are parts of the one magnetic resonance sequence. The plurality of scanning blocks thus take place, for example, during a single magnetic resonance sequence. In this situation, the plurality of scanning blocks may include recurring elements (e.g., excitation pulses or readout windows) of the magnetic resonance sequence. Different shim settings may thus be set during a single magnetic resonance sequence. Shim settings may thus be changed while the magnetic resonance sequence is running. In one embodiment, while the magnetic resonance sequence is running, a renewed frequency adjustment may be performed based on the shim settings. The different shim settings may thus advantageously be matched to different circumstances during the readout of the magnetic resonance sequence. The homogeneity of the primary magnetic field may thus be further improved.

An embodiment provides that the acquisition of the magnetic resonance image data takes place in the plurality of scanning blocks, while maintaining a position of a patient supporting device of the magnetic resonance device. For example, the subject to be examined is positioned on the patient supporting device, which, for example, may be a patient table, during the acquisition of the magnetic resonance image data. For example, there is no shift in a position of the patient supporting device during the acquisition of the magnetic resonance image data. Different shim settings are thus set while the patient supporting device maintains the position. The different scanning blocks may be driven by different gradient settings.

An embodiment provides that the plurality of scanning blocks include different imaging volumes in each case, and the different shim settings are matched to the different imaging volumes in each case. For example, the acquisition of the entire magnetic resonance image data may provide an entire examination volume (e.g., a field of view). The imaging volumes are then, for example, subvolumes of the entire examination volume. The imaging volumes may be spatially disjunct. The imaging volumes may also only partially overlap spatially. If, for example, the acquisition of the magnetic resonance image data provides an acquisition of a plurality of slices, then at least a first slice of the plurality of slices may be acquired during a first scanning block of the plurality of scanning blocks, at least a second slice of the plurality of slices may be acquired during a second scanning block of the plurality of scanning blocks, etc. The shim settings may thus also be matched separately to the different imaging volumes. If, for example, fat tissue of the subject under examination for the most part is localized in a first imaging volume, and water tissue of the subject under examination for the most part is localized in a second imaging volume, then a shim setting matched to the fat tissue may advantageously be set for the first imaging volume while a shim setting matched to the water tissue shim setting may advantageously be set for the second imaging volume. The different shim settings may include different shim volumes. This may provide that a first shim volume is set for a first imaging volume while a second shim volume is set for a second imaging volume, etc. In this context, a shim volume provides, for example, that the shim field set based on the shim setting acts in spatially restricted fashion on the shim volume. The shim volume may spatially correspond to the imaging volume or overlap to a large extent therewith. The matching of a shim setting to an imaging volume may include the ascertainment of a suitable shim setting associated with the imaging volume. For example, a BO field map of the imaging volume may be measured in order to ascertain the shim settings. Local shim currents having a limited effect on the imaging volume may be computed for the shim settings based on the BO field map of the imaging volume. The shim setting may therefore also be matched to that part of the subject under examination that is situated in the imaging volume. Matching the shim setting to the different imaging volumes advantageously results in the fact that a particularly high homogeneity of the primary magnetic field may be present for each imaging volume of the plurality of imaging volumes.

An embodiment provides that prior to the acquisition of magnetic resonance image data a frequency adjustment is carried out in a scanning block of the plurality of scanning blocks based on the shim setting that is set in relation to the scanning block of the plurality of scanning blocks. A frequency adjustment matched to the scanning block of the plurality of scanning blocks may thus be carried out in each case.

An embodiment provides that the acquisition of the magnetic resonance image data includes a plurality of breath-holding cycles, where one breath-holding cycle of the plurality of breath-holding cycles is assigned to one scanning block of the plurality of scanning blocks. A breath-holding cycle (e.g., a breath hold) may be formed, for example, by a process of the subject under examination holding their breath. A breath-holding cycle may last several seconds. For example, a first breath-holding cycle of the plurality of breath-holding cycles may take place during a first scanning block of the plurality of scanning blocks, a second breath-holding cycle of the plurality of breath-holding cycles may take place during a second scanning block of the plurality of scanning blocks, etc. Magnetic resonance image data from different imaging volumes may be acquired during different breath-holding cycles. The shim settings may thus be matched to the plurality of breath-holding cycles.

An embodiment provides that the frequency adjustment takes place during a pause between two breath-holding cycles of the plurality of breath-holding cycles. For example, firstly, a first breath-holding cycle of the two breath-holding cycles takes place, followed by the pause and then a second breath-holding cycle of the two breath-holding cycles. The frequency adjustment that takes place during the pause is then assigned, for example, to the second breath-holding cycle of the two breath-holding cycles. The frequency adjustment is thus performed, for example, by the shim setting that is assigned to the second breath-holding cycle of the two breath-holding cycles. The frequency adjustment may thus take place in a free respiratory phase of the subject under examination during the pause between the two breath-holding cycles. Since the frequency adjustment normally takes a certain time, the shim setting time, the pause between the two breath-holding cycles may be utilized. The examination time may thus be optimally utilized and does not, for example, need to be increased for repeated frequency adjustments. An examination time reduced in this manner advantageously results in increased patient comfort.

One or more of the present embodiments are based on a magnetic resonance device having a computer unit, a shim unit and a control unit. The magnetic resonance device is embodied in order to execute a method according to one or more of the present embodiments.

The magnetic resonance device is thus configured to execute a method for magnetic resonance imaging of a subject under examination. The computer unit is configured to drive the magnetic resonance device such that the acquisition of the magnetic resonance image data takes place in a plurality of scanning blocks. The control unit is configured to drive the shim unit such that different shim settings are set in each case by the shim unit for the plurality of scanning blocks.

The magnetic resonance device may have further control components that are required and/or advantageous for executing a method according to one or more of the present embodiments. Computer programs and further software, by which a processor of the computer unit and/or of the control unit automatically controls and/or executes a process sequence of a method according to one or more of the present embodiments, may be stored on a storage unit of the computer unit and/or of the control unit.

According to an embodiment of the magnetic resonance device, the magnetic resonance device with the computer unit, the shim unit, and the control unit is configured such that the acquisition of the magnetic resonance image data takes place using a magnetic resonance sequence. The plurality of scanning blocks are parts of the one magnetic resonance sequence.

According to an embodiment of the magnetic resonance device, the magnetic resonance device with the computer unit, the shim unit, and the control unit is configured such that the acquisition of the magnetic resonance image data takes place in the plurality of scanning blocks while a position of a patient supporting device of the magnetic resonance device is maintained.

According to an embodiment of the magnetic resonance device, the magnetic resonance device with the computer unit, the shim unit, and the control unit is configured such that the plurality of scanning blocks in each case includes different imaging volumes, and the different shim settings are matched in each case to the different imaging volumes.

According to an embodiment of the magnetic resonance device, the magnetic resonance device with the computer unit, the shim unit, and the control unit is configured such that prior to the acquisition of magnetic resonance image data, a frequency adjustment is carried out in a scanning block of the plurality of scanning blocks based on the shim setting that is set in relation to the scanning block of the plurality of scanning blocks.

According to an embodiment of the magnetic resonance device, the magnetic resonance device with the computer unit, the shim unit, and the control unit is configured such that the acquisition of the magnetic resonance image data includes a plurality of breath-holding cycles. One breath-holding cycle of the plurality of breath-holding cycles is assigned to one scanning block of the plurality of scanning blocks.

According to an embodiment of the magnetic resonance device, the magnetic resonance device with the computer unit, the shim unit, and the control unit is configured such that the frequency adjustment takes place during a pause between two breath-holding cycles of the plurality of breath-holding cycles.

The advantages of the magnetic resonance device according to the present embodiments essentially correspond to the advantages of the method according to the present embodiments explained above in detail. Features, advantages or alternative embodiments mentioned here are likewise also to be transferred to the other subject matters and vice versa. In other words, the features described in conjunction with a method may be applied to the device. The corresponding functional features of the method are embodied by corresponding objective modules (e.g., by hardware modules).

BRIEF DESCRIPTION OF THE DRAWINGS

FIG. 4 shows an exemplary arrangement of imaging volumes in relation to a subject under examination.

DETAILED DESCRIPTION

Figure 1:
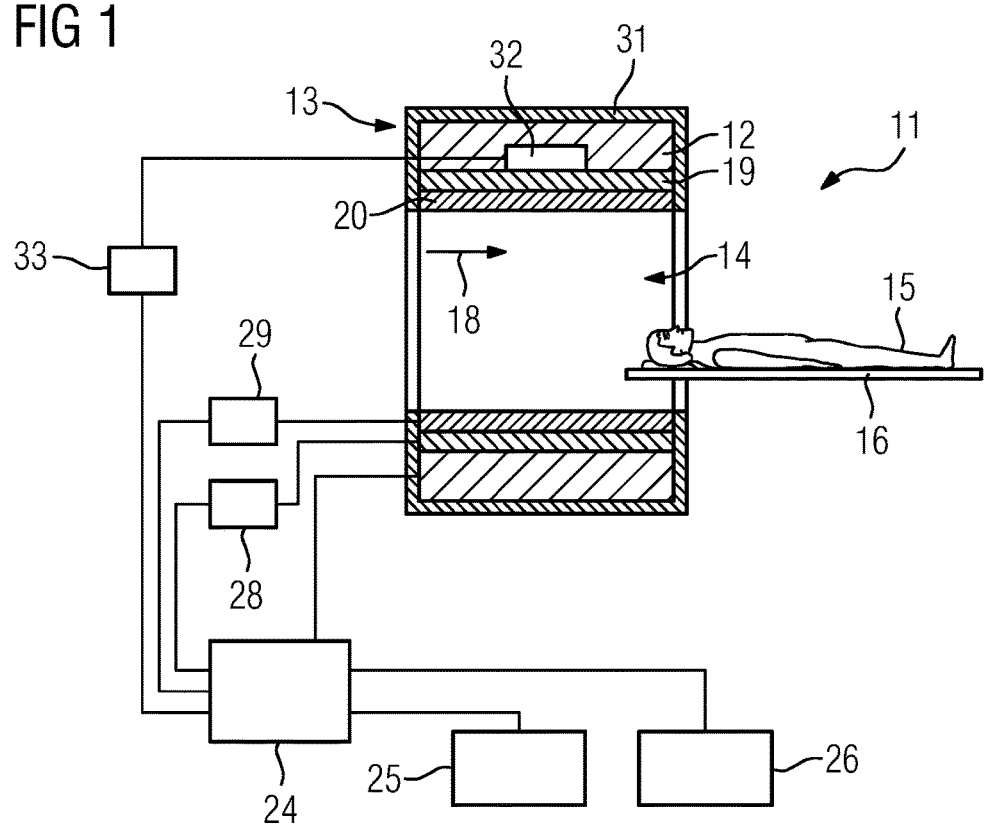
FIG. 1 shows a schematic illustration of one embodiment of a magnetic resonance device.

FIG. 1 shows a schematic illustration of one embodiment of a magnetic resonance device 11. The magnetic resonance device 11 includes a detector unit formed by a magnet unit 13 having a primary magnet 17 for generating a strong and, for example, constant primary magnetic field 18. The magnetic resonance device 11 also includes a cylindrical patient receiving area 14 for accommodating a patient 15. The patient receiving area 14 is enclosed in a cylindrical fashion in a circumferential direction by the magnet unit 13. The patient 15 may be slid into the patient receiving area 14 by a patient supporting device 16 of the magnetic resonance device 11. The patient supporting device 16 has a patient table that is arranged to be capable of movement inside the magnetic resonance device 11. The magnet unit 13 is shielded externally by housing paneling 31 of the magnetic resonance device.

The magnet unit 13 also includes a gradient coil unit 19 in order to generate magnetic field gradients that are used for position encoding during an imaging process. The gradient coil unit 19 is driven by a gradient control unit 28. In addition, the magnet unit 13 has a radio-frequency antenna unit 20 that is configured as a body coil permanently integrated into the magnetic resonance device 10, and a radio-frequency antenna control unit 29 in order to excite a polarization that arises in the primary magnetic field 18 generated by the primary magnet 17. The radio-frequency antenna unit 20 is driven by the radio-frequency antenna control unit 29 and irradiates radio-frequency magnetic resonance sequences into an examination chamber that is essentially formed by the patient receiving area 14. The radio-frequency antenna unit 20 is also configured in order to receive magnetic resonance signals (e.g., emanating from the patient 15).

The magnetic resonance device 11 has a computer unit 24 for controlling the primary magnet 17, the gradient control unit 28, and the radio-frequency antenna control unit 29. The computer unit 24 provides central control of the magnetic resonance device 11, such as, for example, the execution of a predetermined imaging gradient echo sequence. Control information such as, for example, imaging parameters, as well as reconstructed magnetic resonance images may be displayed on a display unit 25 (e.g., on at least one monitor) of the magnetic resonance device 11 for a user. In addition, the magnetic resonance device 11 has an input unit 26 by which information and/or parameters may be entered by a user during a measurement operation. The computer unit 24 may include the gradient control unit 28 and/or radio-frequency antenna control unit 29 and/or the display unit 25 and/or the input unit 26.

The magnetic resonance device 11 also includes a shim unit 32 and a control unit 33 for driving the shim unit. In this situation, the control unit 33 is connected to the computer unit 24 with respect to data exchange. The control unit 33 may also be a part of the computer unit 24.

The shim unit 32 includes shim coils by way of example. The current that flows through the shim coils of the shim unit 32 may be adjusted by the control unit 33 based on shim settings. The magnetic resonance device 11 together with the computer unit 24, the shim unit 32 and the control unit 33 is thus configured to execute a method according to one or more of the present embodiments.

The magnetic resonance device 11 illustrated may include further components that magnetic resonance devices 11 usually include. The general operation of a magnetic resonance device 11 is known to the person skilled in the art, and a detailed description of the further components has therefore been dispensed with.

Figure 2:
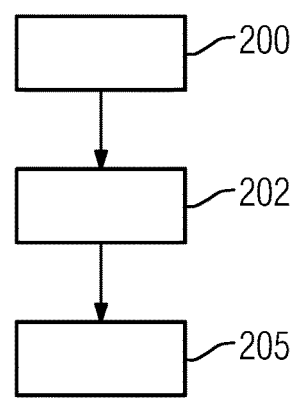
FIG. 2 shows a flowchart of a first embodiment of a method.

FIG. 2 shows a flowchart of a first embodiment of a method.

In act 200, magnetic resonance imaging of a subject under examination 15 by a magnetic resonance device 11 is prepared. A user may use the input unit 26 to select a magnetic resonance sequence in order to acquire magnetic resonance image data. Thereupon, measurement parameters for the magnetic resonance sequence for acquisition of the magnetic resonance image data may be set manually by an input unit 26 of the magnetic resonance device 11 or automatically by a computer unit 24 of the magnetic resonance device 11.

In a further act 202, the acquisition of the magnetic resonance image data takes place in a plurality of scanning blocks by the magnetic resonance device 11. In this situation, the acquisition of the magnetic resonance image data takes place, for example, using a magnetic resonance sequence. The plurality of scanning blocks are parts of the magnetic resonance sequence. For the plurality of scanning blocks, different shim settings are set in each case in the act 202 by a shim unit 32 and a control unit 33 for driving the shim unit 32.

In a further act 205, a reconstruction of magnetic resonance images takes place by the computer unit 24 based on the magnetic resonance image data acquired in the further act 202. The magnetic resonance images may be output, for example, on a display unit 25 of the magnetic resonance device 11.

Figure 3:
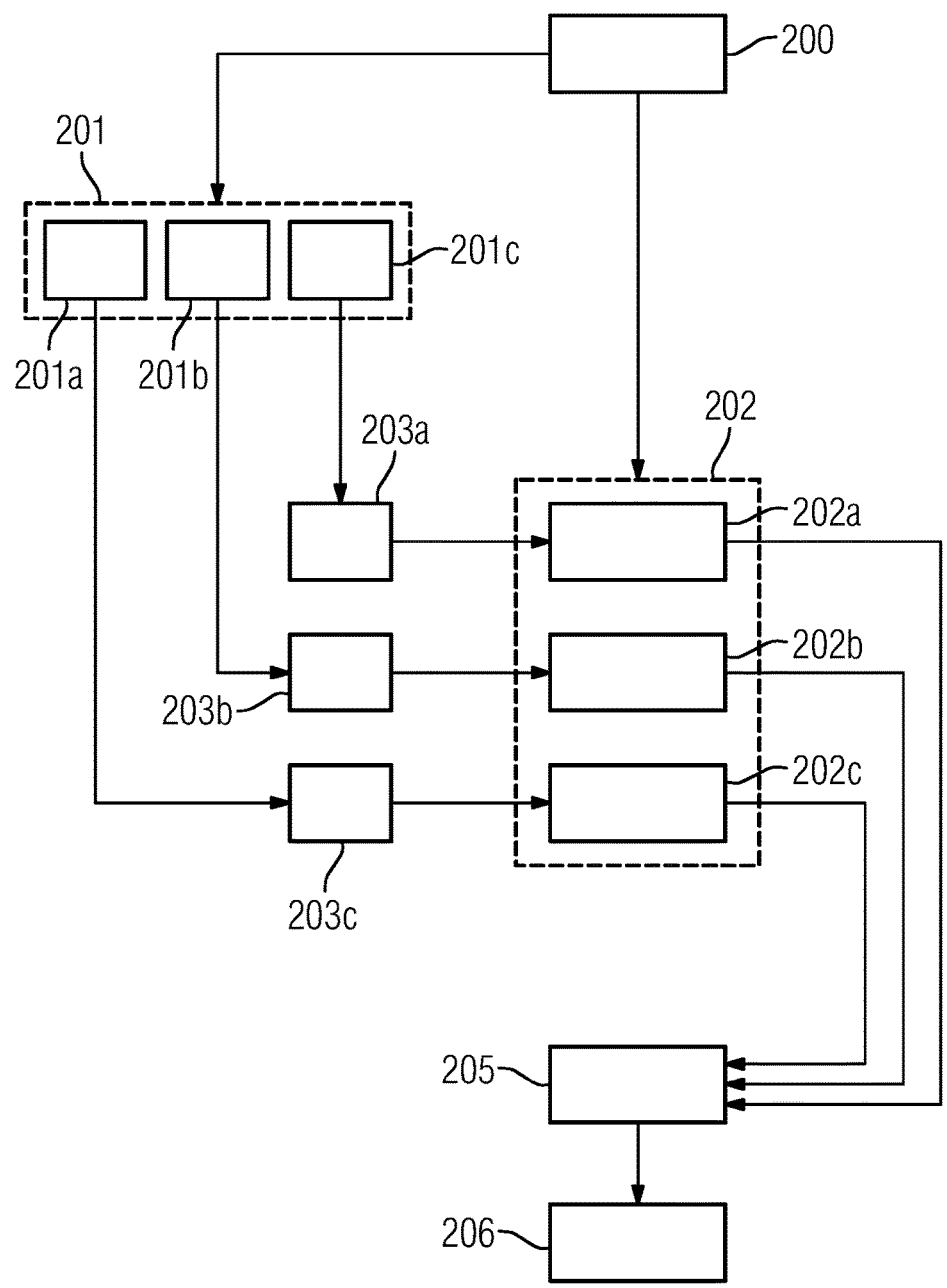
FIG. 3 shows a flowchart of a second embodiment of a method.

FIG. 3 shows a flowchart of a second embodiment of a method.

The following description is restricted essentially to the differences from the exemplary embodiment in FIG. 2. Reference is made to the description of the exemplary embodiment in FIG. 2 with respect to method acts remaining the same. Method acts essentially remaining the same are numbered using the same reference characters.

The second embodiment of the method, shown in FIG. 3, essentially includes the method acts 200, 202, 205 of the first embodiment of the method according to FIG. 2. In addition, the second embodiment of the method, shown in FIG. 3, includes additional method acts and subacts. An alternative process sequence to FIG. 3, which has only a part of the additional method acts and/or subacts illustrated in FIG. 2, may also be provided. An alternative process sequence to FIG. 3 may also have additional method acts and/or subacts.

In the example, acquisition of magnetic resonance image data takes place in the further method act 202 in three scanning blocks 202a, 202b, 202c in accordance with the magnetic resonance sequence for magnetic resonance imaging prepared in the first method act 200. In this situation, the three scanning blocks 202a, 202b, 202c are executed one after the other. The magnetic resonance sequence may also provide for the acquisition of magnetic resonance image data in a differing number of scanning blocks 202a, 202b, 202c.

The acquisition of the magnetic resonance image data is illustrated in FIG. 4. FIG. 4 shows a subject to be examined 15 (e.g., a patient 15). In the example, magnetic resonance image data is to be acquired in accordance with the magnetic resonance sequence in 18 axial slices 401 in the body region of the patient 15. The axial slices 401 together form an examination volume 400 of the magnetic resonance sequence.

In the case illustrated in FIG. 4, in accordance with the magnetic resonance sequence, the 18 axial slices 401 are acquired evenly distributed over the three scanning blocks 202a, 202b, 202c. Thus, in the first scanning block 202a, a first imaging volume 402a, which in the example, includes the first six slices of the axial slices 401, is scanned. In the second scanning block 202b a second imaging volume 402b, which in the example, includes the second six slices of the axial slices 401, is scanned. In the third scanning block 202c, a third imaging volume 402b, which in the example, includes the third six slices of the axial slices 401, is scanned. The plurality of scanning blocks 202a, 202b, 202c thus include different respective imaging volumes 402a, 402b, 402c.

In the case illustrated, the acquisition of the magnetic resonance image data includes a plurality of breath-holding cycles for the patient 15. In this situation, one breath-holding cycle of the plurality of breath-holding cycles is assigned in each case to one scanning block 202a, 202b, 202c of the plurality of scanning blocks 202a, 202b, 202c. Thus, for example, the first imaging volume 402a is scanned in a first breath-holding cycle, the second imaging volume 402b is scanned in a second breath-holding cycle, and the third imaging volume 402c is scanned in a third breath-holding cycle.

In the case illustrated, the acquisition of the magnetic resonance image data in the plurality of scanning blocks 202a, 202b, 202c takes place while maintaining a position of a patient supporting device 16 of the magnetic resonance device 11.

In a further method act 201, shim settings 201a, 201b, 201c are computed by control unit 33 based on the magnetic resonance sequence prepared in the first method step 200. In the case shown, three different shim settings 201a, 201b, 201c that are specific to different scanning blocks 202a, 202b, 202c are computed.

In the present case, the different shim settings 201a, 201b, 201c are matched in each case to the different imaging volumes 402a, 402b, 402c. Thus, a first shim setting 201a is matched to the first imaging volume 402a. The first shim setting 201a includes a shim volume, the effect of which is restricted to the first imaging volume 402a (e.g., the first six slices of the axial slices 401 (see FIG. 4)). During the acquisition of the magnetic resonance image data, the different shim settings 201a, 201b, 201c are set in each case for the associated scanning blocks 202a, 202b, 202c by the computer unit 24 and/or the control unit 33.

In the case illustrated, in further method act 203a, 203b, 203c, prior to the acquisition of the magnetic resonance image data, a frequency adjustment is carried out by a frequency adjustment unit (not shown) in each case in a scanning block 202a, 202b, 202c based on the shim setting 201a, 201b, 201c that is set in relation to the scanning block 202a, 202b, 202c of the three scanning blocks 202a, 202b, 202c. In this situation, the frequency adjustment advantageously takes place during a pause between two breath-holding cycles of the plurality of breath-holding cycles.

In the further method act 205, the magnetic resonance image data acquired in the plurality of scanning blocks 202a, 202b, 202c is merged to enable the magnetic resonance images to be reconstructed.

In a further method act 206, the magnetic resonance images may be output on the display unit 25 of the magnetic resonance device 11 and/or stored by the computer unit 24 in a database.

The procedure presented enables an advantageous adjustment of the shim settings 201a, 201b, 201c to the plurality of scanning blocks 202a, 202b, 202c. The homogeneity of a primary magnetic field 18 of the magnetic resonance device 11 may thereby be increased during the acquisition of the magnetic resonance image data. The image quality of the magnetic resonance images may thereby be improved.

For example, a saturation of fat tissue by fat saturation pulses (e.g., a fat saturation) may be performed during the acquisition of the magnetic resonance image data. An adequate fat saturation may be dependent on a high homogeneity of the primary magnetic field 18. The homogeneity, improved by the proposed procedure, of the primary magnetic field 19 may thus result in an improved fat saturation and thereby to an improved image quality of the magnetic resonance images. For example, an improved saturation of fat tissue, which is localized in a peripheral region of the examination volume 400, may be achieved. Other mechanisms such as, for example, an increased homogeneity of the primary magnetic field 19 resulting in an improvement of the image quality may be provided.

The method acts illustrated in FIGS. 2 and 3 of the method according to one or more of the present embodiments are performed by the magnetic resonance device. The magnetic resonance device includes the necessary software and/or computer programs that are stored in a storage unit of the computer unit and/or in the control unit of the magnetic resonance device. The software and/or computer programs include program resources configured to execute the method according to one or more of the present embodiments when the computer program and/or the software is executed in the computer unit and/or the control unit by a processor unit of the computer unit and/or of the control unit.

Although one or more of the present embodiments have been illustrated and described in detail by the exemplary embodiments, the invention is nevertheless not restricted by the disclosed examples. Other variations may be derived therefrom by the person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for magnetic resonance imaging of a subject under examination by a magnetic resonance device, the method comprising:
    acquiring magnetic resonance image data in a plurality of scanning blocks, wherein the acquiring comprises setting different shim settings in each case for the plurality of scanning blocks,
    wherein the plurality of scanning blocks comprise different imaging volumes in each case,
    wherein the different shim settings are matched to the different imaging volumes,
    wherein the acquisition of the magnetic resonance image data comprises a plurality of breath-holding cycles, and
    wherein one breath-holding cycle of the plurality of breath-holding cycles is assigned to one scanning block of the plurality of scanning blocks.

2. The method of claim 1, wherein the acquisition of the magnetic resonance image data takes place using a magnetic resonance sequence, and
    wherein the plurality of scanning blocks are parts of the magnetic resonance sequence.

3. The method of claim 2, wherein the acquisition of the magnetic resonance image data takes place in the plurality of scanning blocks while maintaining a position of a patient supporting device of the magnetic resonance device.

4. The method of claim 2, wherein the plurality of scanning blocks comprise different imaging volumes in each case, and
    wherein the different shim settings are matched to the different imaging volumes.

5. The method of claim 1, wherein the acquisition of the magnetic resonance image data takes place in the plurality of scanning blocks while maintaining a position of a patient supporting device of the magnetic resonance device.

6. The method of claim 1, further comprising carrying out, prior to the acquisition of the magnetic resonance image data, a frequency adjustment in a scanning block of the plurality of scanning blocks based on the shim setting that is set in relation to the scanning block of the plurality of scanning blocks.

7. The method of claim 1, wherein the frequency adjustment takes place during a pause between two breath-holding cycles of the plurality of breath-holding cycles.

8. A magnetic resonance device comprising:
    a computer unit configured to drive the magnetic resonance device to acquire magnetic resonance image data in a plurality of scanning blocks;
    a shim unit; and
    a control unit configured to drive the shim unit such that different shim settings are set in each case by the shim unit for the plurality of scanning blocks,
    wherein the plurality of scanning blocks comprise different imaging volumes in each case, wherein the different shim settings are matched to the different imaging volumes, wherein the acquisition of the magnetic resonance image data comprises a plurality of breath-holding cycles, and wherein one breath-holding cycle of the plurality of breath-holding cycles is assigned to one scanning block of the plurality of scanning blocks.

9. The magnetic resonance device of claim 8, wherein the acquisition of the magnetic resonance image data takes place using a magnetic resonance sequence, and wherein the plurality of scanning blocks are parts of the magnetic resonance sequence.

10. The magnetic resonance device of claim 8, wherein the acquisition of the magnetic resonance image data takes place in the plurality of scanning blocks while maintaining a position of a patient supporting device of the magnetic resonance device.

* * * * *